(12) United States Patent
Feng et al.

(10) Patent No.: US 11,387,148 B2
(45) Date of Patent: Jul. 12, 2022

(54) SEMICONDUCTOR DEVICE

(71) Applicant: UNITED MICROELECTRONICS CORP., Hsin-Chu (TW)

(72) Inventors: Li-Wei Feng, Kaohsiung (TW); Shih-Hung Tsai, Tainan (TW); Chao-Hung Lin, Changhua County (TW); Hon-Huei Liu, Kaohsiung (TW); Shih-Fang Hong, Tainan (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 66 days.

(21) Appl. No.: 16/872,395

(22) Filed: May 12, 2020

(65) Prior Publication Data

US 2020/0273758 A1 Aug. 27, 2020

Related U.S. Application Data

(60) Division of application No. 16/053,737, filed on Aug. 2, 2018, now Pat. No. 10,692,777, which is a
(Continued)

(30) Foreign Application Priority Data

Feb. 6, 2015 (CN) .......................... 201510062339.9

(51) Int. Cl.
*H01L 21/8238* (2006.01)
*H01L 21/225* (2006.01)
(Continued)

(52) U.S. Cl.
CPC .. *H01L 21/823821* (2013.01); *H01L 21/2255* (2013.01); *H01L 21/2256* (2013.01);
(Continued)

(58) Field of Classification Search
None
See application file for complete search history.

(56) References Cited

U.S. PATENT DOCUMENTS 7,955,928 B2 6/2011 Chan et al.
8,883,570 B2 11/2014 Lu
(Continued)

FOREIGN PATENT DOCUMENTS

CN 102386230 A 3/2012
CN 103531478 A 1/2014
(Continued)

*Primary Examiner* — Long Pham
(74) *Attorney, Agent, or Firm* — Winston Hsu

(57) ABSTRACT

A semiconductor device includes: a substrate having a first region and a second region; a first fin-shaped structure on the first region and a second fin-shaped structure on the second region, wherein each of the first fin-shaped structure and the second fin-shaped structure comprises a top portion and a bottom portion; a first doped layer around the bottom portion of the first fin-shaped structure; a second doped layer around the bottom portion of the second fin-shaped structure; a first liner on the first doped layer; and a second liner on the second doped layer.

10 Claims, 5 Drawing Sheets

Related U.S. Application Data continuation of application No. 15/294,797, filed on Oct. 17, 2016, now Pat. No. 10,068,808, which is a division of application No. 14/637,400, filed on Mar. 4, 2015, now Pat. No. 9,502,252.

(51) Int. Cl.
*H01L 21/324* (2006.01)
*H01L 27/092* (2006.01)
*H01L 29/66* (2006.01)
*H01L 29/78* (2006.01)

(52) U.S. Cl.
CPC .... *H01L 21/324* (2013.01); *H01L 21/823814* (2013.01); *H01L 21/823892* (2013.01); *H01L 27/0924* (2013.01); *H01L 29/66803* (2013.01); *H01L 29/7851* (2013.01); *H01L 21/823807* (2013.01)

(56) References Cited

U.S. PATENT DOCUMENTS

| | | | |
|---|---|---|---|
| 2012/0238061 A1* | 9/2012 | Fischer | H01L 29/66666 438/157 |
| 2013/0115763 A1 | 5/2013 | Takamure | |
| 2015/0243739 A1 | 8/2015 | Chen | |

FOREIGN PATENT DOCUMENTS

| | | |
|---|---|---|
| CN | 103579002 A | 2/2014 |
| CN | 104051502 A | 9/2014 |

* cited by examiner

SEMICONDUCTOR DEVICE

CROSS REFERENCE TO RELATED APPLICATIONS

This is a division application of U.S. patent application Ser. No. 16/053,737, filed Aug. 2, 2018, which is a continuation application of U.S. patent application Ser. No. 15/294,797, filed Oct. 17, 2016, which is a division application of U.S. application Ser. No. 14/637,400 (U.S. Pat. No. 9,502,252) filed Mar. 4, 2015. The above-mentioned applications are included in their entirety herein by reference.

BACKGROUND OF THE INVENTION

1. Field of the Invention

The invention relates to a semiconductor device and fabrication method thereof, and more particularly, to a semiconductor device having doped layer and liner on the bottom portion of the semiconductor device and fabrication method thereof.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the design of fin-shaped structure in current FinFET fabrication still resides numerous bottlenecks which induces current leakage of the device and affects overall performance of the device. Hence, how to improve the current FinFET fabrication and structure has become an important task in this field.

SUMMARY OF THE INVENTION

According to a preferred embodiment of the present invention, a method for fabricating semiconductor device is disclosed. The method includes the steps of: providing a substrate having at least one fin-shaped structure thereon, in which the fin-shaped structure comprises a top portion and a bottom portion; and forming a doped layer and a first liner around the bottom portion of the fin-shaped structure.

According to another aspect of the present invention, a method for fabricating semiconductor device is disclosed. The method includes the steps of: providing a substrate having a first region and a second region defined thereon; forming a first fin-shaped structure on the first region and a second fin-shaped structure on the second region, in which each of the first fin-shaped structure and the second fin-shaped structure comprises a top portion and a bottom portion; forming a first doped layer and a first liner around the bottom portion of the second fin-shaped structure; and forming a second doped layer and a second liner around the bottom portion of the first fin-shaped structure.

According to another embodiment of the present invention, a semiconductor device is disclosed. The semiconductor device includes: a substrate having a fin-shaped structure thereon, in which the fin-shaped structure comprises a top portion and a bottom portion; a doped layer around the bottom portion of the fin-shaped structure; and a first liner on the doped layer.

According to yet another embodiment of the present invention, a semiconductor device includes: a substrate having a first region and a second region; a first fin-shaped structure on the first region and a second fin-shaped structure on the second region, wherein each of the first fin-shaped structure and the second fin-shaped structure comprises a top portion and a bottom portion; a first doped layer around the bottom portion of the first fin-shaped structure; a second doped layer around the bottom portion of the second fin-shaped structure; a first liner on the first doped layer; and a second liner on the second doped layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
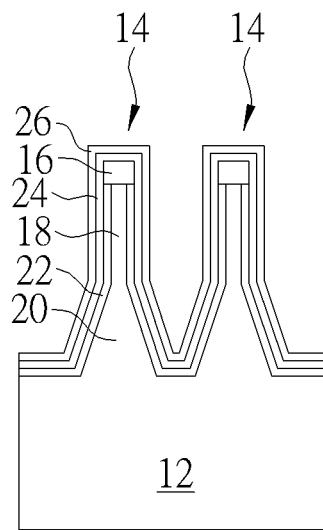
FIGS. 1-4 illustrate a method for fabricating semiconductor device according to a first embodiment of the present invention.

Referring to FIGS. 1-4, FIGS. 1-4 illustrate a method for fabricating semiconductor device according to a first embodiment of the present invention. As shown in FIG. 1, a substrate 12, such as a silicon substrate or silicon-on-insulator (SOI) substrate is provided, and a transistor region, such as a PMOS region or a NMOS region is defined on the substrate 12. At least a first fin-shaped structure 14 is formed on the substrate 12 and a hard mask 16 is formed on the each fin-shaped structure 14, in which each of the fin-shaped structures 14 includes a top portion 18 and a bottom portion 20. Despite two fin-shaped structures 14 are disclosed in this embodiment, the quantity of the fin-shaped structures 14 could be adjusted according to the demand of the product.

The formation of the fin-shaped structure 14 could be accomplished by first forming a patterned mask (now shown) on the substrate, 12, and an etching process is performed to transfer the pattern of the patterned mask to the substrate 12. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure.

Next, a liner 22 could be formed selectively on the surface of the fin-shaped structures 14 through in-situ steam generation (ISSG) process, in which the liner 22 is preferably composed of silicon oxide and in addition to covering the top portion 18 and bottom portion 20 of the fin-shaped structures 14, the liner 22 also covers the surface of the substrate 12. Next, a doped layer 24 and another liner 26 are sequentially formed on the liner 22 and covering the entire fin-shaped structures 14. In this embodiment, the liner 26 is preferably composed of silicon nitride and the material of the doped layer 24 could be adjusted depending on the type of transistor being fabricated afterwards. For instance, if a NMOS transistor were to be fabricated, the doped layer 24 is preferably composed of thin film containing p-type dopants, such as borosilicate glass (BSG). Conversely, if a PMOS transistor were to be fabricated, the doped layer 24 is preferably composed of thin film containing n-type dopants, such as phosphosilicate glass (PSG).

Figure 2:
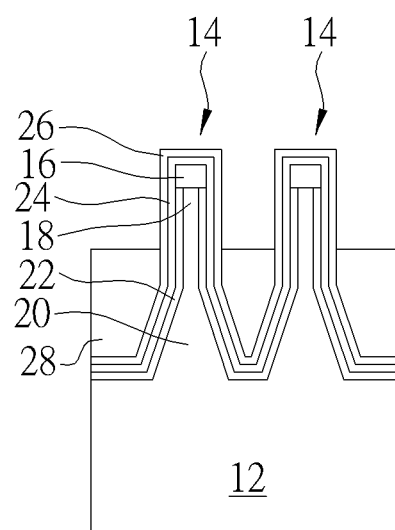

Next, as shown in FIG. 2, a passivation layer, such as a dielectric layer 28 is formed on the liner 26 to cover the fin-shaped structures 14 entirely, and an etching back process is conducted to remove part of the dielectric layer 28 so that the top surface of remaining dielectric layer 28 is approximately between the top portion 18 and bottom portion 20 of the fin-shaped structures 14. In this embodiment, the dielectric layer 28 is preferably an organic dielectric layer (ODL), but not limited thereto.

Figure 3:
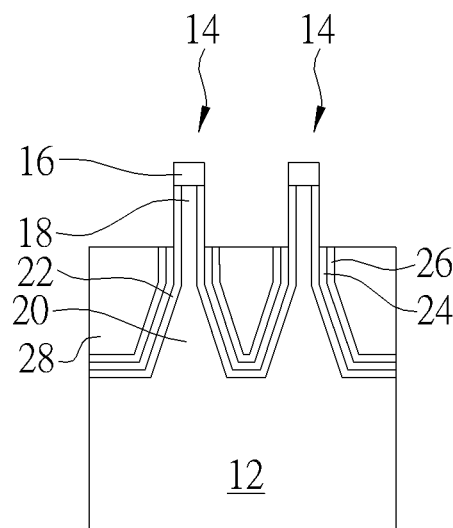

Next, as shown in FIG. 3, another etching process is conducted by using the dielectric layer 28 as mask to remove part of the liner 26 and doped layer 24 not covered by the dielectric layer 28. For instance, the liner 26 and doped layer 24 around the top portion 18 of fin-shaped structures 14 are removed to expose the top portion 18 of the fin-shaped structures 14 and the hard mask 16. It should be noted that the liner 26 could be used to protect the top portion 18 of fin-shaped structures 14 during the etching process.

Figure 4:
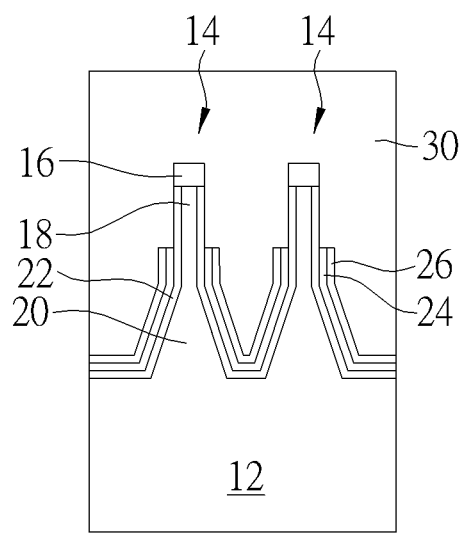

Next, as shown in FIG. 4, the dielectric layer 28 is removed completely, and a dielectric layer 30 composed of silicon oxide preferably through flowable chemical vapor deposition (FCVD) process is formed on the fin-shaped structures 14, and an annealing process is conducted to drive the dopants from the doped layer 24 into the bottom portion 20 of fin-shaped structures 14 and/or substrate 12 to form an anti-punch-through (APT) layer for preventing current leakage. It should be noted that since the doped layer 24 composed of either BSG or PSG are covered on the fin-shaped structures 14 depending on the type of transistor being fabricated, the dopants being driven into the bottom portion 20 through annealing process also differ from the material of doped layer 24 being used and the type of transistor being fabricated. For instance, if a NMOS transistor were to be fabricated and the doped layer 24 on the fin-shaped structures 14 is composed of BSC p-type dopants such as boron are preferably driven into the bottom portion 20 and/or substrate 12 through annealing process, whereas if a PMOS transistor were to be fabricated and the doped layer 24 on the fin-shaped structures 14 is composed of PSG; n-type dopants such as phosphorus are driven into the bottom portion 20 and/or substrate 12 through annealing process. Next, etching process and/or chemical mechanical polishing (CMP) process could be conducted to remove part of the dielectric layer 30 for forming a shallow trench isolation (STI). Transistor elements including gate structure and source/drain regions could also be formed thereafter depending on the demand of product, and the details of which are not explained herein for the sake of brevity.

It should be noted that the aforementioned annealing process not only drives dopants from the doped layer 24 into the bottom portion 20 of fin-shaped structures 14 and/or substrate 12, it also solidifies the originally flowable and viscous dielectric layer 30 formed through FCVD process into a much more solid and concrete structure, removes part of impurities such as nitrogen and hydrogen from the dielectric layer 30, and repairs layer defect thereby increasing isolation effectiveness.

It should be noted that instead of performing annealing process to drive dopants from the doped layer 24 into bottom portion 20 and/or substrate 12 after depositing the dielectric layer 30, it would also be desirable to perform annealing process before the formation of dielectric layer 30, such as after removing liner 26 and doped layer 24 not protected by the dielectric layer 28 and before removing the dielectric layer 28. Or, it would be desirable to perform annealing process after removing the dielectric layer 28 and before forming the dielectric layer 30, remove the doped layer 24 completely after the annealing process, and then forming the dielectric layer 30 on the fin-shaped structures 14, which is also within the scope of the present invention.

Referring to FIG. 4, which further discloses a semiconductor device structure according to a first embodiment of the present invention. As shown in FIG. 4, the semiconductor device includes a substrate 12, at least a fin-shaped structure 14 disposed on the substrate 12, a liner 22 disposed on top portion 18 and bottom portion of the fin-shaped structure 14, a doped layer 24 around the bottom portion 20 and another liner 26 disposed on the doped layer 24. In this embodiment, the liner 22 is preferably composed of silicon oxide, the doped layer 24 could be composed of BSG or PSG and the liner 26 is composed of silicon nitride.

Figure 5:
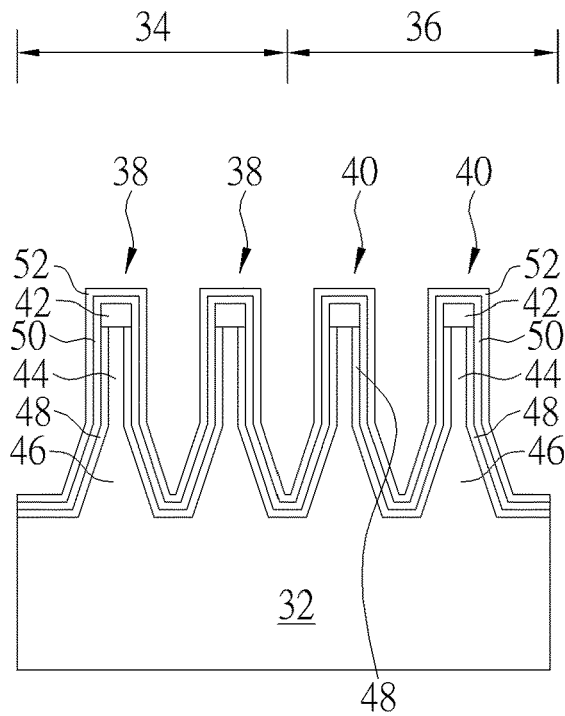
FIGS. 5-10 illustrate a method for fabricating CMOS transistor device according to a second embodiment of the present invention.

Referring to FIGS. 5-10, FIGS. 5-10 illustrate a method for fabricating CMOS transistor device according to a second embodiment of the present invention. As shown in FIG. 5, a substrate 32, such as a silicon substrate or SOI substrate is provided, and a PMOS region 34 and a NMOS region 36 are defined on the substrate 32. At least a fin-shaped structure 38 is formed on the PMOS region 34, at least a fin-shaped structure 40 is formed on the NMOS region 36, and a hard mask 42 is formed on each of the fin-shaped structures 38 and 40, in which each of the fin-shaped structures 38 and 40 includes a top portion 44 and a bottom portion 46. Despite two fin-shaped structures 38 are formed on PMOS region 34 and two fin-shaped structures 40 are formed on NMOS region 36 in this embodiment, the quantity of the fin-shaped structures 38 and 40 could be adjusted according to the demand of the product.

Figure 6:
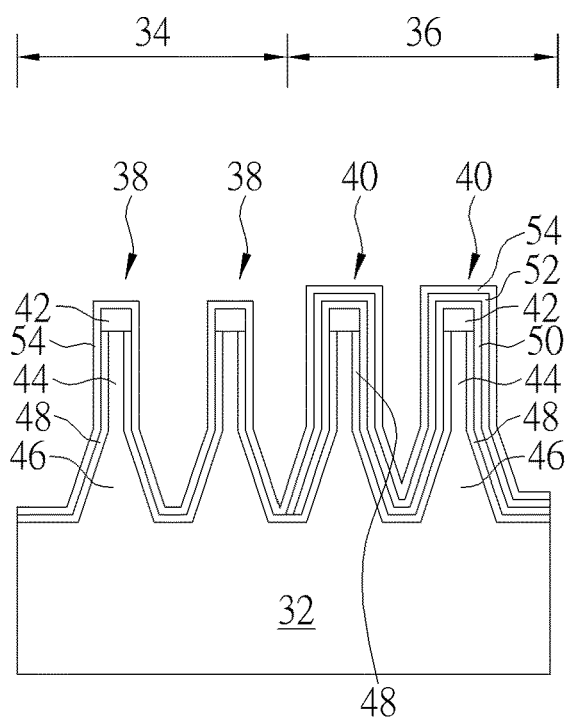
Figure 7:
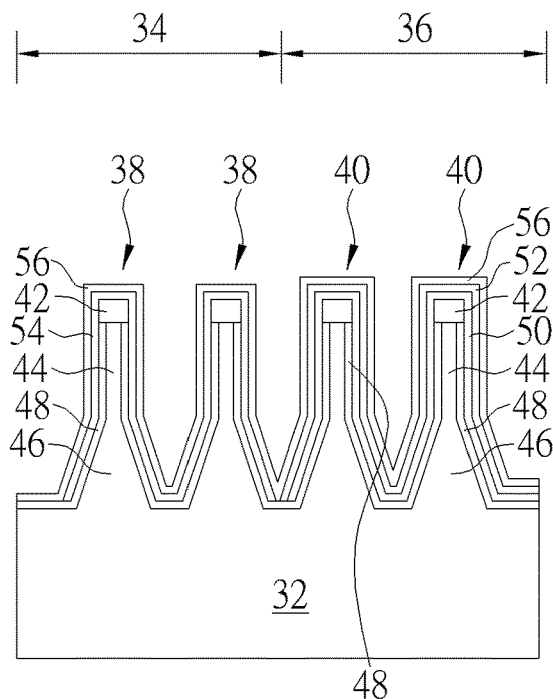

Next, a liner 48 could be formed selectively on the surface of the fin-shaped structures 38 and 40 through ISSG process, in which the liner 48 is preferably composed of silicon oxide and in addition to covering the top portion 44 and bottom portion 46 of the fin-shaped structures 38 and 40, the liner 48 also covers the surface of the substrate 32. Next, a doped layer 50 and another liner 52 are sequentially formed on the liner 48 and covering the entire fin-shaped structures 38 and 40. In this embodiment, the liner 52 is preferably composed of silicon nitride and the doped layer 50 is composed of material containing p-type dopants such as BSG Next, as shown in FIG. 6, a patterned resist (not shown) is disposed on the fin-shaped structures 40 of NMOS region 36, and an etching process is conducted by using the patterned resist as mask to remove the liner 52 and doped layer 50 from PMOS region 34 for exposing the liner 48 and hard mask 42 on PMOS region 34. After stripping the patterned resist, another doped layer 54 is formed on the exposed liner 48 and hard mask 42 of PMOS region 34 and the liner 52 on NMOS region 36, in which the doped layer 54 is preferably composed of material containing n-type dopants such as PSG Next, as shown in FIG. 7, another patterned resist (not shown) is formed on the doped layer 54 of PMOS region 34, and an etching process is conducted by using the patterned resist as mask to remove the doped layer 54 from NMOS region 36 for exposing the liner 52 again. After stripping the patterned resist from PMOS region 34, another liner 56 is deposited on both PMOS region 34 and NMOS region 36, such as on the doped layer 54 of PMOS region 34 and liner 52 of NMOS region 36.

Figure 8:
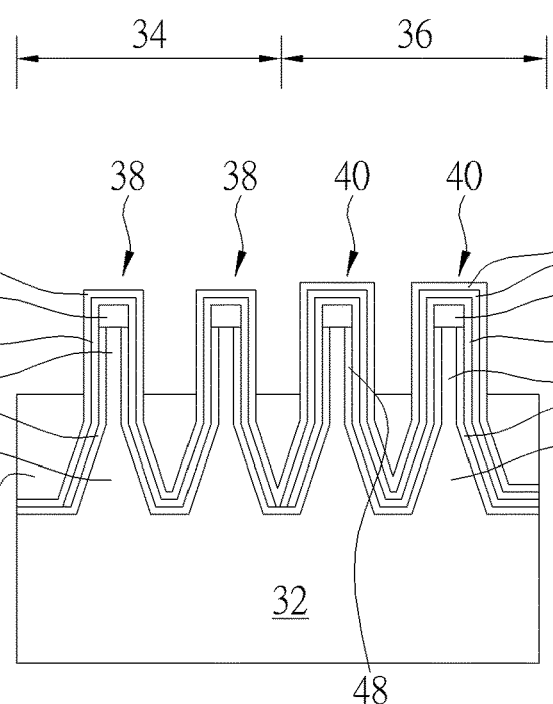

Next, as shown in FIG. 8, a passivation layer, such as a dielectric layer 58 is formed on the liner 56 of both PMOS region 34 and NMOS region 36, and an etching back process is conducted to remove part of the dielectric layer 58 so that the top surface of the remaining dielectric layer 58 is between the top portion 44 and bottom portion 46 of fin-shaped structures 38 and 40. In this embodiment, the dielectric layer 58 is preferably an organic dielectric layer (ODL), but not limited thereto.

Figure 9:
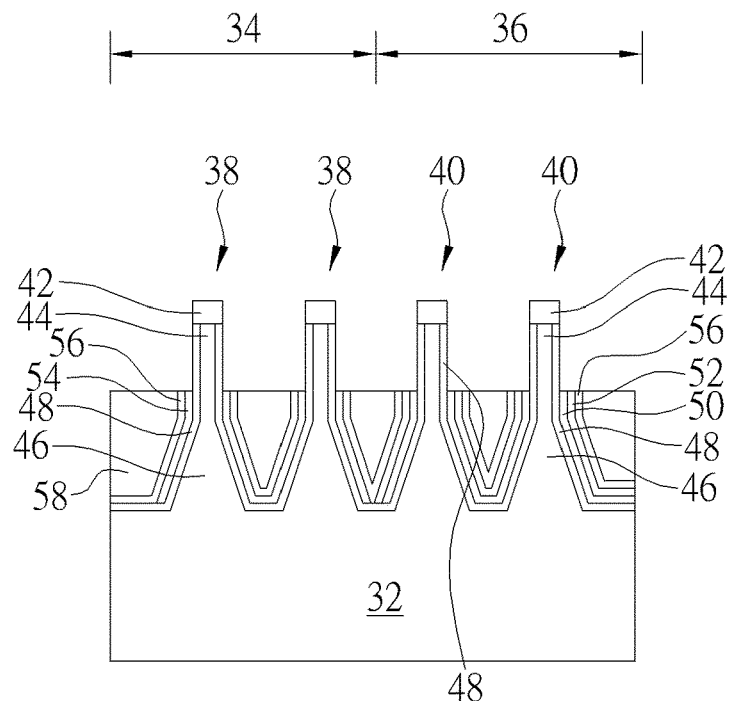

Next, as shown in FIG. 9, another etching process is conducted by using the dielectric layer 58 as mask to remove the liner 56, doped layer 54, liner 52, and doped layer 50 not protected by the dielectric layer 58, such as the liners 56 and 52 and doped layers 54 and 50 around the top portions 44 of fin-shaped structures 38 and 40. This exposes the top portions 44 of fin-shaped structures 38 and 40 and the hard masks 42.

Figure 10:
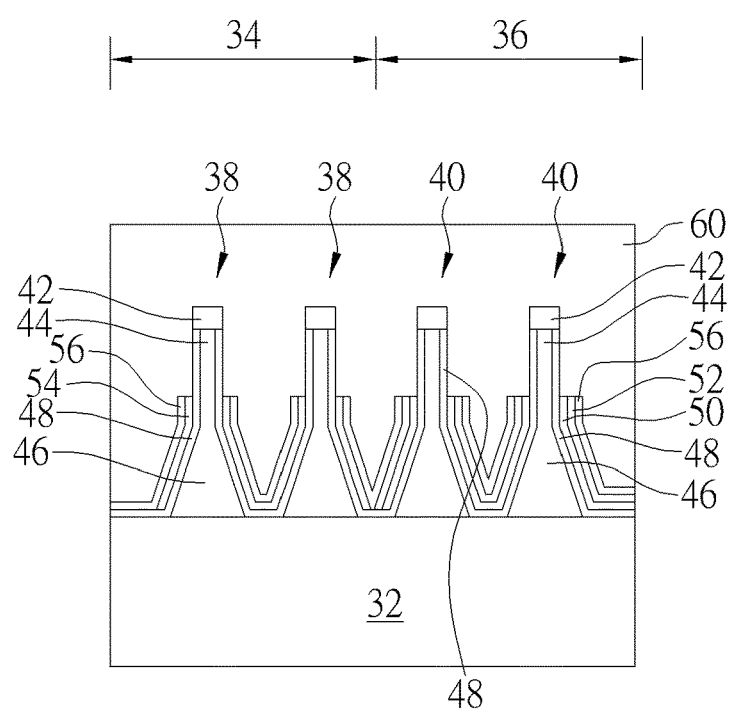

Next, as shown in FIG. 10, after removing the dielectric layer 58 completely, a dielectric layer 60 composed of silicon oxide preferably through FCVD process is formed on the fin-shaped structures 38 and 40, and an annealing process is conducted to drive dopants from the doped layers 54 and 50 into the bottom portion 46 of fin-shaped structures 38 and 40 and/or substrate 32. Specifically, phosphorus ions from the doped layer 54 composed of PSG on PMOS region 34 are driven into the bottom portions 46 of fin-shaped structures 38, and boron ions from the doped layer 50 composed of BSG on NMOS region 36 are driven into the bottom portions 46 of fin-shaped structures 40. This forms an anti-punch-through (APT) layer on each transistor region to prevent current leakage. Next, etching process and/or chemical mechanical polishing (CMP) process could be conducted to remove part of the dielectric layer 60 for forming a shallow trench isolation (STI), and transistor elements including gate structure and source/drain regions could also be formed thereafter depending on the demand of product, and the details of which are not explained herein for the sake of brevity. Similarly, the aforementioned annealing process not only drives dopants from the doped layers 54 and 50 into the bottom portions 46 of fin-shaped structures 38 and 40 and/or substrate 32, it also solidifies the originally flowable and viscous dielectric layer 60 formed through FCVD process into a much more solid and concrete structure, removes part of impurities such as nitrogen and hydrogen from the dielectric layer 60, and repairs layer defect thereby increasing isolation effectiveness.

Also, similar to the aforementioned embodiment, instead of performing annealing process to drive dopants into the substrate after depositing the dielectric layer 60, it would also be desirable to perform annealing process before the formation of dielectric layer 60, such as before or after removing the dielectric layer 58. The doped layers 54 and 50 could then be removed completely after the annealing process, and the dielectric layer 60 is covered directly on the fin-shaped structures 38 and 40, which is also within the scope of the present invention.

Overall, the present invention discloses an approach of applying solid-state doping (SSD) technique on a FinFET device, which preferably forms a doped layer and liner on bottom portion of fin-shaped structures and then performs an annealing process to drive dopants from the doped layer into the bottom portion of the fin-shaped structures and/or substrate to form an anti-punch-through (APT) layer for resolving current leakage issue of the device. In this embodiment, the material of the doped layer could be adjusted depending on the type of transistor being fabricated. For instance, if NMOS transistor were to be fabricated, the doped layer is preferably composed of BSG whereas if PMOS transistor were to be fabricated, the doped layer is preferably composed of PSG Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a first region and a second region, wherein the first region comprises a PMOS region and the second region comprises a NMOS region;
   a first fin-shaped structure on the first region and a second fin-shaped structure on the second region, wherein each of the first fin-shaped structure and the second fin-shaped structure comprises a top portion and a bottom portion;
   a first doped layer around the bottom portion of the first fin-shaped structure;
   a second doped layer around the bottom portion of the second fin-shaped structure, wherein the first doped layer and the second doped layer comprise different materials;
   a first liner on the first doped layer; and
   a second liner on the second doped layer.

2. The semiconductor device of claim 1, further comprising a third liner on the top portion and the bottom portion of the first fin-shaped structure.

3. The semiconductor device of claim 2, further comprising a first hard mask on the third liner and the first fin-shaped structure.

4. The semiconductor device of claim 1, further comprising a fourth liner on the top portion and the bottom portion of the second fin-shaped structure.

5. The semiconductor device of claim 4, further comprising a second hard mask on the fourth liner and the second fin-shaped structure.

6. The semiconductor device of claim 1, further comprising a fifth liner on the second liner.

7. The semiconductor device of claim 6, wherein top surfaces of the second doped layer, the second liner, and the fifth liner are coplanar.

8. The semiconductor device of claim 1, wherein top surfaces of the first doped layer and the first liner are coplanar.

9. The semiconductor device of claim 1, wherein the first doped layer comprises phosphosilicate glass (PSG).

10. The semiconductor device of claim 1, wherein the second doped layer comprises borosilicate glass (BSG).

* * * * *